(12) United States Patent
Ok et al.

(10) Patent No.: US 10,741,756 B1
(45) Date of Patent: Aug. 11, 2020

(54) PHASE CHANGE MEMORY WITH A PATTERNING SCHEME FOR TANTALUM NITRIDE AND SILICON NITRIDE LAYERS

(71) Applicant: INTERNATIONAL BUSINESS MACHINES CORPORATION, Armonk, NY (US)

(72) Inventors: Injo Ok, Loudonville, NY (US); Nicole Saulnier, Slingerlands, NY (US); Iqbal R. Saraf, Cobleskill, NY (US); Kevin W. Brew, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/425,311

(22) Filed: May 29, 2019

(51) Int. Cl.
*H01L 45/00* (2006.01)

(52) U.S. Cl.
CPC .......... *H01L 45/1253* (2013.01); *H01L 45/06* (2013.01); *H01L 45/1233* (2013.01); *H01L 45/1616* (2013.01); *H01L 45/1683* (2013.01); *H01L 45/141* (2013.01)

(58) Field of Classification Search
CPC ............. H01L 45/1253; H01L 45/1233; H01L 45/1616; H01L 45/1683
USPC ........................................................ 438/382
See application file for complete search history.

(56) References Cited

U.S. PATENT DOCUMENTS

| | | |
|---|---|---|
| 7,254,059 B2 | 8/2007 | Li et al. |
| 7,479,649 B2 | 1/2009 | Lung |
| 7,495,946 B2 | 2/2009 | Gruening-von Schwerin et al. |
| 7,605,079 B2 | 10/2009 | Lai et al. |
| 7,619,237 B2 | 11/2009 | Lung |
| 8,233,317 B2 | 7/2012 | Breitwisch et al. |
| 8,735,283 B2 | 5/2014 | Arnold et al. |
| 9,564,577 B1 | 2/2017 | Hsu et al. |
| 2009/0029031 A1 | 1/2009 | Lowrey |
| 2011/0031461 A1 | 2/2011 | Kang et al. |
| 2011/0155993 A1 | 6/2011 | Chen |
| 2016/0372334 A1 | 12/2016 | Mignot et al. |

*Primary Examiner* — Elias Ullah
(74) *Attorney, Agent, or Firm* — Tutunjian & Bitetto, P.C.; Vazken Alexanian

(57) ABSTRACT

A method of forming a phase change memory device is provided. The method includes depositing an electrode layer on a phase change material core, and forming a sacrificial layer on the electrode layer. The method further includes depositing a planarization layer on the sacrificial layer, and depositing an anti-reflective coating on the planarization layer. The method further includes forming a template on the anti-reflective coating, and removing a portion of the anti-reflective coating, a portion of the planarization layer, and a portion of the sacrificial layer to form a reduced height sacrificial layer and a sacrificial layer section beneath the planarization layer section. The method further includes removing the anti-reflective coating section and planarization layer section to expose the sacrificial layer section, and removing the reduced height sacrificial layer and a portion of the electrode layer to form a top electrode on the phase change material core.

20 Claims, 11 Drawing Sheets

PHASE CHANGE MEMORY WITH A PATTERNING SCHEME FOR TANTALUM NITRIDE AND SILICON NITRIDE LAYERS

BACKGROUND

The present invention generally relates to phase change memory devices, and more particularly to fabrication of phase change memory devices utilizing tantalum nitride layers.

Phase change material can be used as a type of non-volatile memory to store data. Each memory cell of a phase-change random access memory can include phase change material that can be addressed. The information can be stored in the phase change material by changing the electrical resistance of the phase change material.

SUMMARY

In accordance with an embodiment of the present invention, a method of forming a phase change memory device is provided. The method includes depositing an electrode layer on a phase change material core, and forming a sacrificial layer on the electrode layer. The method further includes depositing a planarization layer on the sacrificial layer, and depositing an anti-reflective coating on the planarization layer. The method further includes forming a template on the anti-reflective coating, and removing a portion of the anti-reflective coating to form an anti-reflective coating section, a portion of the planarization layer to form a planarization layer section, and a portion of the sacrificial layer to form a reduced height sacrificial layer and a sacrificial layer section beneath the planarization layer section. The method further includes removing the anti-reflective coating section and planarization layer section to expose the sacrificial layer section, and removing the reduced height sacrificial layer and a portion of the electrode layer to form a top electrode on the phase change material core and a sacrificial layer plate on the top electrode.

In accordance with another embodiment of the present invention, a method of forming a phase change memory device is provided. The method includes forming a bottom electrode on a substrate, and forming a phase change material core on the bottom electrode. The method further includes depositing an electrode layer on the phase change material core, and forming a sacrificial layer on the electrode layer. The method further includes depositing a planarization layer on the sacrificial layer, and depositing an anti-reflective coating on the planarization layer. The method further includes forming a template on the anti-reflective coating, and removing a portion of the anti-reflective coating to form an anti-reflective coating section, a portion of the planarization layer to form a planarization layer section, and a portion of the sacrificial layer to form a reduced height sacrificial layer and a sacrificial layer section beneath the planarization layer section. The method further includes removing the anti-reflective coating section and planarization layer section to expose the sacrificial layer section, and removing the reduced height sacrificial layer and a portion of the electrode layer to form a top electrode on the phase change material core and a sacrificial layer plate on the top electrode.

In accordance with yet another embodiment of the present invention, a method of forming a phase change memory device is provided. The method includes forming a bottom electrode on a substrate, and forming a phase change material core on the bottom electrode. The method further includes depositing a tantalum nitride electrode layer on the phase change material core, and forming a silicon nitride sacrificial layer on the electrode layer. The method further includes depositing a planarization layer on the sacrificial layer, and depositing an anti-reflective coating on the planarization layer. The method further includes forming a template on the anti-reflective coating, and removing a portion of the anti-reflective coating to form an anti-reflective coating section, a portion of the planarization layer to form a planarization layer section, and a portion of the sacrificial layer to form a reduced height sacrificial layer and a sacrificial layer section beneath the planarization layer section. The method further includes removing the anti-reflective coating section and planarization layer section to expose the sacrificial layer section, and removing the reduced height sacrificial layer and a portion of the electrode layer to form a top electrode on the phase change material core and a sacrificial layer plate on the top electrode.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the invention provide a method of fabricating a phase change memory device utilizing transition metal nitride layers, where etching can redeposit the transition metal nitride material on the sidewalls of other material layers. Reactive ion etching of a transition metal nitride layer to form a top electrode can sputter the nitride material onto adjacent sidewalls of a masking layer, thereby preventing complete removal of the masking layers.

Embodiments of the invention provide a method of fabricating a phase change memory device using a sacrificial layer on the transition metal nitride layer, where the sacrificial layer and other overlying masking layers have sufficient thicknesses to allow removal of the sacrificial layer and masking layers before etching the transition metal nitride layer to minimize redeposition on exposed surfaces of other layer features. Etching of a masking layer directly on a transition metal nitride layer can result in damage to the transition metal nitride layer and sticking of the sputtered transition metal nitride to the exposed masking layer surfaces.

Embodiments of the invention provide a phase change material memory device having a transition metal nitride top electrode. The transition metal nitride top electrode can be tantalum nitride that can be patterned using a reactive ion etch (RIE). The phase change material memory device can include a transition metal layer between a phase change material and the transition metal nitride top electrode to avoid crystallization of the transition metal nitride top electrode.

Exemplary applications/uses to which the present invention can be applied include, but are not limited to: phase change material memory devices.

It is to be understood that aspects of the present invention will be described in terms of a given illustrative architecture; however, other architectures, structures, substrate materials and process features and steps can be varied within the scope of aspects of the present invention.

Figure 1:
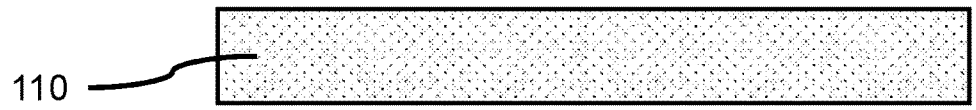
FIG. 1 is a cross-sectional side view showing a substrate, in accordance with an embodiment of the present invention.

Referring now to the drawings in which like numerals represent the same or similar elements and initially to FIG. 1, a cross-sectional side view of a substrate is shown, in accordance with an embodiment of the present invention.

In one or more embodiments, a phase change material memory device can be formed on a substrate 110, where the substrate can be a semiconductor material wafer or a semiconductor-on-insulator (SeOI) wafer (e.g., silicon-on-insulator (SOI)). In various embodiments, the substrate 110 can include a semiconductor material, including, but not limited to, silicon (Si), silicon germanium (SiGe), silicon carbide (SiC), germanium (Ge), a III-V semiconductor material (e.g., gallium arsenide (GaAs), indium phosphide (InP), or a II-VI semiconductor material (e.g., zinc selenide (ZnSe) cadmium telluride (CdTe).

In one or more embodiments, the substrate 110 can have other devices, including, but not limited to, fin field effect transistors (FinFETs), metal-oxide-semiconductor field effect transistors (MOSFETs), resistors, capacitors, and inductors. The devices can be fabricated through front-end-of-line (FEOL) processing.

Figure 2:
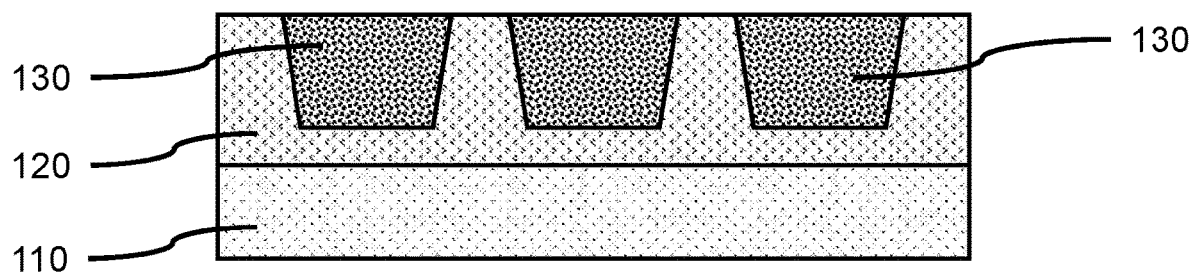
FIG. 2 is a cross-sectional side view showing a first interlayer dielectric (ILD) layer on the substrate, and a plurality of lower conductive pads formed in the ILD layer, in accordance with an embodiment of the present invention.

FIG. 2 is a cross-sectional side view showing a first interlayer dielectric (ILD) layer on the substrate, and a plurality of lower conductive pads formed in the ILD layer, in accordance with an embodiment of the present invention.

In one or more embodiments, a first interlayer dielectric (ILD) layer 120 can be formed on the substrate 110 and previously formed devices, where the ILD layer 120 can be formed by a blanket deposition, for example, chemical vapor deposition (CVD), plasma enhanced CVD (PECVD), physical vapor deposition (PVD), spin-on process, or a combination thereof. The first interlayer dielectric (ILD) layer 120 can cover the previously formed devices and provide sufficient thickness for forming a first metallization layer including one or more lower conductive pads 130, which can form electrical connections to the previously formed devices and subsequently formed phase change material memory devices.

In one or more embodiments, the first interlayer dielectric (ILD) layer 120 can be a dielectric material, including, but not limited to, silicon oxide (SiO), a low-k dielectric material, for example, fluorine doped silicon oxide (SiO:F), carbon doped silicon oxide (SiO:C), hydrogen silsesquioxane (HSQ) and methylsilsesquioxane (MSQ), tetraethoxysilane (TEOS), and combinations thereof.

In one or more embodiments, the lower conductive pads 130 can be formed in the first ILD layer 120 by patterning a masking layer using lithography and development, and etching the exposed portions of the lower ILD layer 120 to form recesses. A conductive material can be deposited into the recesses and a chemical-mechanical polishing (CMP) can be used to remove excess conductive material from the first ILD layer 120.

In various embodiments, the lower conductive pads 130 can be a metal, including, but not limited to, copper (Cu), aluminum (Al), tungsten (W), manganese (MN), molybdenum (Mo), platinum (Pt), gold (Au), silver (Ag), a nonmetal, for example, graphite, carbons nanotubes (CNTs), or suitable combinations thereof.

Figure 3:
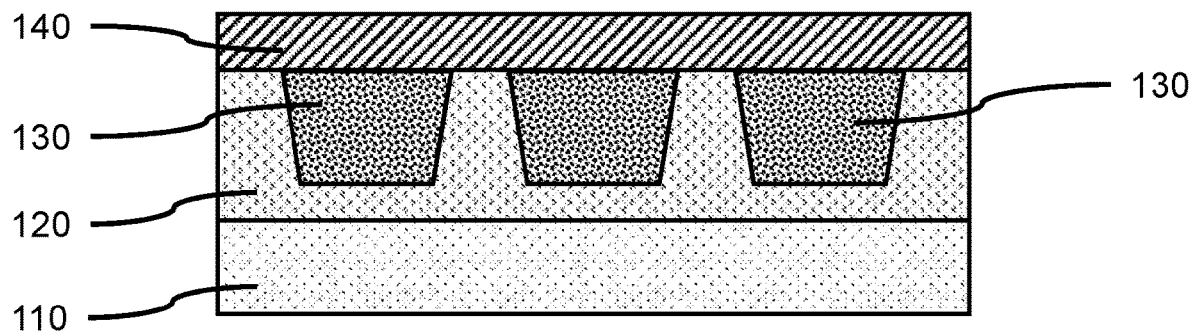
FIG. 3 is a cross-sectional side view showing an isolation layer formed on the first interlayer dielectric (ILD) layer, in accordance with an embodiment of the present invention.

FIG. 3 is a cross-sectional side view showing an isolation layer formed on the first interlayer dielectric (ILD) layer, in accordance with an embodiment of the present invention.

In one or more embodiments, an isolation layer 140 can be formed on the first interlayer dielectric (ILD) layer 120 and lower conductive pads 130, where the isolation layer 140 can be formed by a conformal deposition (e.g., ALD, PEALD), a blanket deposition (e.g., CVD, PECVD), or a combination thereof. The isolation layer 140 can be formed over the exposed top surfaces of the lower conductive pads 130 to act as a diffusion barrier and to provide electrical isolation.

In various embodiments, the isolation layer 140 can have a thickness in a range of about 10 nm to about 40 nm, or about 20 nm to about 30 nm, or about 25 nm, although other thicknesses are also contemplated.

In various embodiments, the isolation layer 140 can be an electrically insulating, dielectric layer, where the dielectric material can be, for example, silicon nitride (SiN), silicon oxynitride (SiON), silicon carbonitride (SiCN), silicon boro carbonitride (SiBCN), NBLoK™ from Applied Materials® (i.e., nitrogen doped silicon carbide (SiC:N), or a combination thereof.

In a non-limiting exemplary embodiments, the isolation layer 140 can be stoichiometric silicon nitride ($Si_3N_4$) or NBLoK™ from Applied Materials® (i.e., nitrogen doped silicon carbide (SiC:N).

Figure 4:
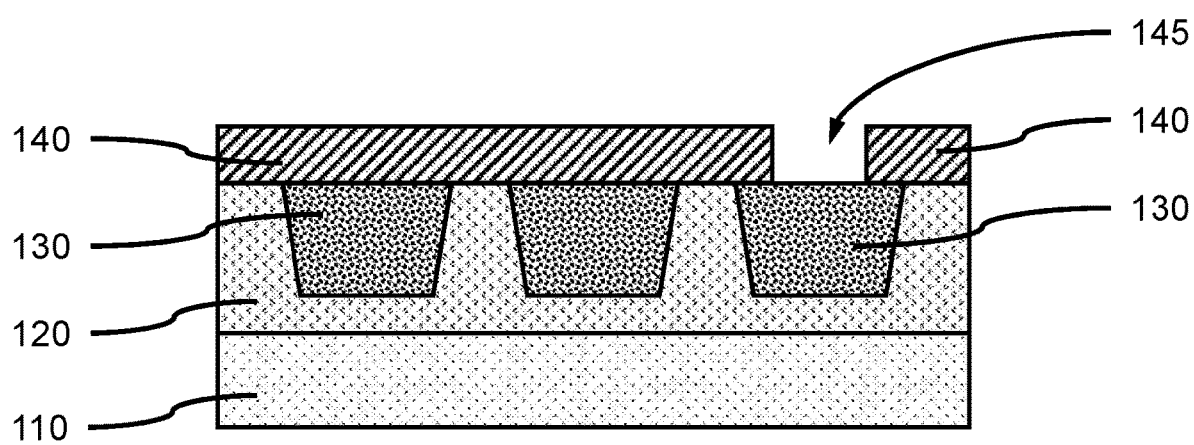
FIG. 4 is a cross-sectional side view showing an opening in the isolation layer that exposes a lower conductive pad, in accordance with an embodiment of the present invention.

FIG. 4 is a cross-sectional side view showing an opening in the isolation layer that exposes a lower conductive pad, in accordance with an embodiment of the present invention.

In one or more embodiments, an opening 145 can be formed in the isolation layer 140 that exposes an underlying lower conductive pad 130. One or more openings can be formed in the isolation layer 140 using lithographic processes and etching to expose a plurality of conductive pads.

In various embodiments, the opening 145 can have a width in a range of about 30 nm to about 80 nm, or about 36 nm to about 56 nm, or about 40 nm to about 50 nm, although other widths are also contemplated.

Figure 5:
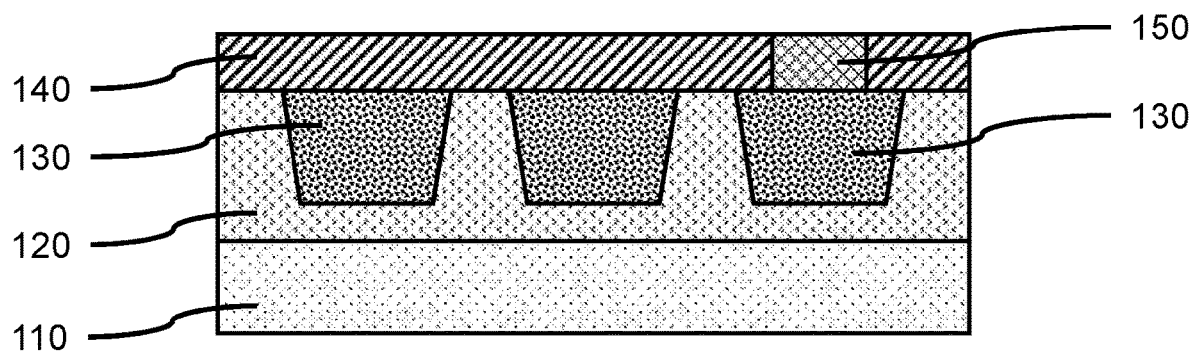
FIG. 5 is a cross-sectional side view showing a bottom electrode formed in the opening on the lower conductive pad, in accordance with an embodiment of the present invention.

FIG. 5 is a cross-sectional side view showing a bottom electrode formed in the opening on the lower conductive pad, in accordance with an embodiment of the present invention.

In one or more embodiments, a bottom electrode 150 can be formed in the opening 145, where the bottom electrode 150 can be formed by a conformal deposition (e.g., ALD, PEALD), a blanket deposition (e.g., CVD, PVD), or a combination thereof. The bottom electrode 150 can fill the opening 145 and be coplanar with the top surface of the isolation layer 140 after chemical-mechanical polishing (CMP). A transition metal nitride can be formed in the opening(s) and excess material can be removed from the surface of the isolation layer 140 using CMP.

In various embodiments, the bottom electrode 190 can be a transition metal nitride, including, but not limited to, tantalum nitride (TaN), titanium nitride (TiN), tungsten nitride (WN), or a combination there of.

Figure 6:
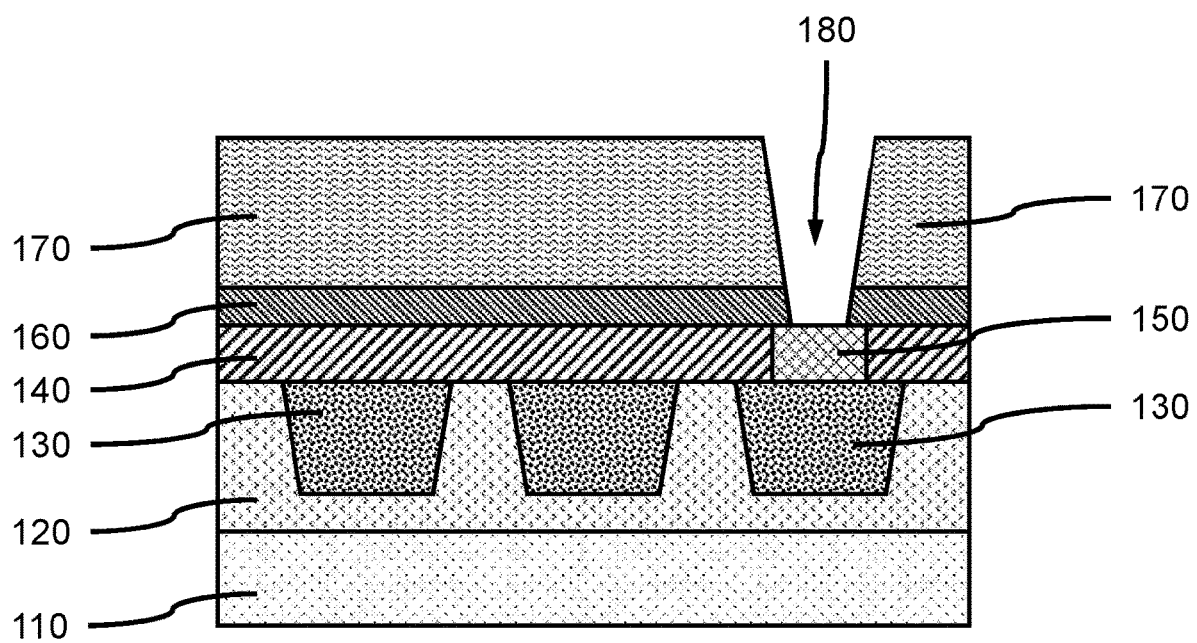
FIG. 6 is a cross-sectional side view showing a blocking layer formed on the isolation layer and bottom electrode, a fill layer formed on the blocking layer, and a trench formed through the fill layer and blocking layer over the bottom electrode, in accordance with an embodiment of the present invention.

FIG. 6 is a cross-sectional side view showing a blocking layer formed on the isolation layer and bottom electrode, a fill layer formed on the blocking layer, and a trench formed through the fill layer and blocking layer over the bottom electrode, in accordance with an embodiment of the present invention.

In one or more embodiments, a blocking layer 160 can be formed on the isolation layer 140 and bottom electrode 150, where the blocking layer 160 can be formed by a blanket deposition (e.g., CVD, PECVD, PVD).

In various embodiments, the blocking layer 160 can have a thickness in a range of about 10 nm to about 40 nm, or about 20 nm to about 30 nm, or about 25 nm, although other thicknesses are also contemplated. The blocking layer can have a different thickness than the isolation layer 140.

In various embodiments, the blocking layer 160 can be an electrically insulating, dielectric layer, where the dielectric material can be, for example, silicon oxide (SiO), silicon nitride (SiN), silicon oxynitride (SiON), silicon boro carbonitride (SiBCN), or a combination thereof. The blocking layer 150 can act as an etch stop and protect the underlying isolation layer 140.

In a non-limiting exemplary embodiments, the blocking layer 160 can be stoichiometric silicon nitride ($Si_3N_4$). In various embodiments, the isolation layer 140 can be NBLoK™ from Applied Materials® and the blocking layer 160 can be stoichiometric silicon nitride ($Si_3N_4$), so the two layers are different materials. In various embodiments, the isolation layer 140 and the blocking layer 160 can be the same stoichiometric silicon nitride ($Si_3N_4$), where the blocking layer 160 can cover the bottom electrode 150.

In one or more embodiments, a fill layer 170 can be formed on the blocking layer 160, where the fill layer can be formed by a blanket deposition (e.g., CVD, PECVD, PVD, spin-on). The fill layer 170 can provide an electrically insulating layer for forming the phase change material memory devices.

In one or more embodiments, the fill layer 170 can be a dielectric material, including, but not limited to, silicon oxide (SiO) a low-k dielectric material, for example, fluorine doped silicon oxide (SiO:F), carbon doped silicon oxide (SiO:C), hydrogen silsesquioxane (HSQ) and methylsilsesquioxane (MSQ), tetraethoxysilane (TEOS), and combinations thereof.

In various embodiments, the fill layer 170 can have a thickness in a range of about 50 nm to about 150 nm, or about 100 nm to about 120 nm, or about 110 nm, although other thicknesses are also contemplated. The thickness can be sufficient to form a phase change material device.

In one or more embodiments, a trench 180 can be formed in the fill layer 170 and blocking layer 160, where the trench can be formed by masking the fill layer using lithography to expose portions of the fill layer 170 above the bottom electrode 150. The exposed portions of the fill layer 170 can be removed using a selective reactive ion etch (RIE) to expose a surface portion of the underlying blocking layer 160. The exposed portion(s) of the blocking layer 160 can be removed with another selective RIE to expose at least a portion of the bottom electrode(s) 150.

In various embodiments, the bottom critical dimension (BCD) of the trench 180 can be in a range of about 24 nm to about 36 nm, although other BCD are also contemplated. In various embodiments, the bottom electrode 150 can have a width greater than the BCD of the trench 180.

Figure 7:
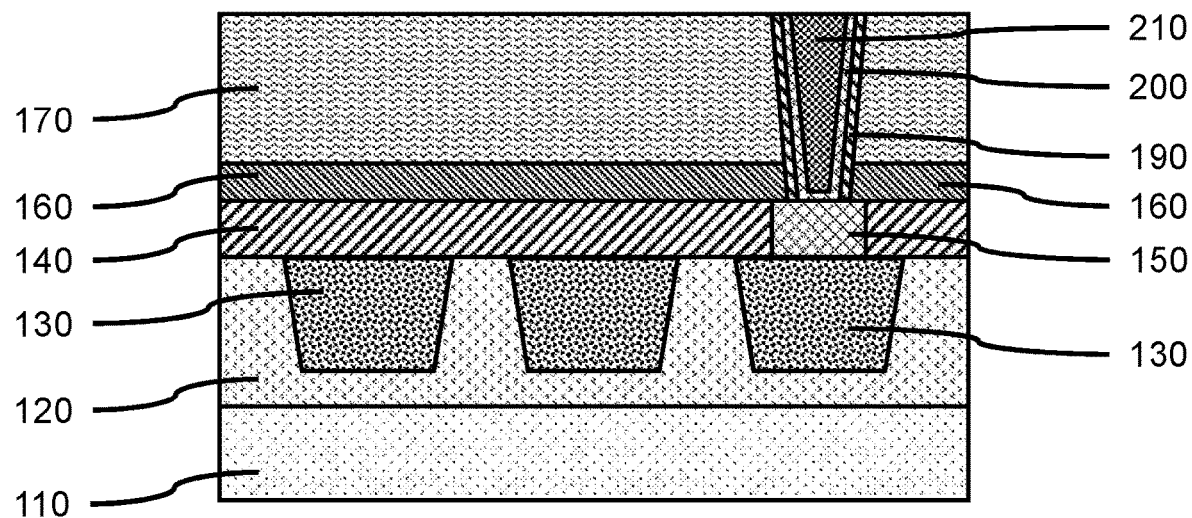
FIG. 7 is a cross-sectional side view showing a protective layer formed on the sidewalls of the trench, a liner layer formed on the protective layer and bottom electrode, and a phase change material core formed on the bottom electrode and liner layer, in accordance with an embodiment of the present invention.

FIG. 7 is a cross-sectional side view showing a protective layer formed on the sidewalls of the trench, a liner layer formed on the protective layer and bottom electrode, and a phase change material core formed on the bottom electrode and liner layer, in accordance with an embodiment of the present invention.

In one or more embodiments, a protective layer 190 can be formed on the sidewalls of the trench 180 and on the exposed surface of the bottom electrode 150, where the protective layer 190 can be formed by chemical vapor deposition (CVD) or atomic layer deposition (ALD). The protective layer 190 can separate a subsequently formed liner layer from the fill layer 170. In various embodiments, the portion of the protective layer 190 deposited on the surface of the bottom electrode 150 can be removed using a selective RIE, while leaving the protective layer 190 on the sidewalls of the trench 180.

In various embodiments, the protective layer 190 can have a thickness in a range of about 2 nm to about 5 nm, or about 3 nm, although other thicknesses are also contemplated.

In various embodiments, the protective layer 190 can be a dielectric material, including, but not limited to, silicon oxide (SiO), silicon nitride (SiN), silicon oxynitride (SiON), aluminum oxide (AlO), or combinations thereof. In a non-limiting exemplary embodiment, the protective layer 190 can be stoichiometric silicon nitride ($Si_3N_4$) or stoichiometric aluminum oxide ($Al_2O_3$).

In one or more embodiments, a liner layer 200 can be formed on the protective layer 190, and the bottom electrode 190, where the liner layer 200 can be formed by a conformal deposition, including, but not limited to, atomic layer deposition (ALD) or plasma enhanced ALD (PEALD). The liner layer 200 can remain on the surface of the bottom electrode 150.

In various embodiments, the liner layer 200 can be a transition metal nitride, including, but not limited to, tantalum nitride (TaN), titanium nitride (TiN), tungsten nitride (WN), or a combination there of. The liner layer 200 can be the same material as the bottom electrode 150.

In various embodiments, the liner layer 200 can have a thickness in a range of about 2 nm to about 5 nm, or about 3 nm, although other thicknesses are also contemplated.

In one or more embodiments, a phase change material core 210 can be formed on the bottom electrode 150 and liner layer 200, where the phase change material core 210 can be formed by CVD. In various embodiments, the phase change material core 210 can be formed in the trench directly on the bottom electrode 150 and liner layer 200 to form an electrical connection.

In one or more embodiments, the phase change material can be formed from chalcogenide based materials. The chalcogens can include any of the four elements oxygen (O), sulfur (S), selenium (Se), and tellurium (Te), forming part of group VI of the periodic table. Chalcogenides include compounds of a chalcogen with a more electropositive element or radical. Chalcogenide alloys include combinations of chalcogenides with other materials, such as transition metals. A chalcogenide alloy usually contains one or more elements from group IV of the periodic table of elements, including germanium (Ge) and tin (Sn). The chalcogenide alloys can also include combinations including one or more of antimony (Sb), gallium (Ga), indium (In), and silver (Ag). The phase change based memory materials can include alloys of Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te, and Te/Ge/Sb/S. In the family of Ge/Sb/Te alloys, a wide range of alloy compositions may be used. The compositions can be characterized as $Te_aGe_bSb_{100-(a+b)}$. More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. The phase change material core 210 can undergo CMP.

In one or more embodiments, the phase change material core 210 can be germanium antimony tellurium (GeSbTe), germanium antimony (GeSb), germanium tellurium (GeTe), antimony tellurium (SbTe), or germanium antimony tellurium (GeSbTe) with 5-50% of $SiO_2$.

Figure 8:
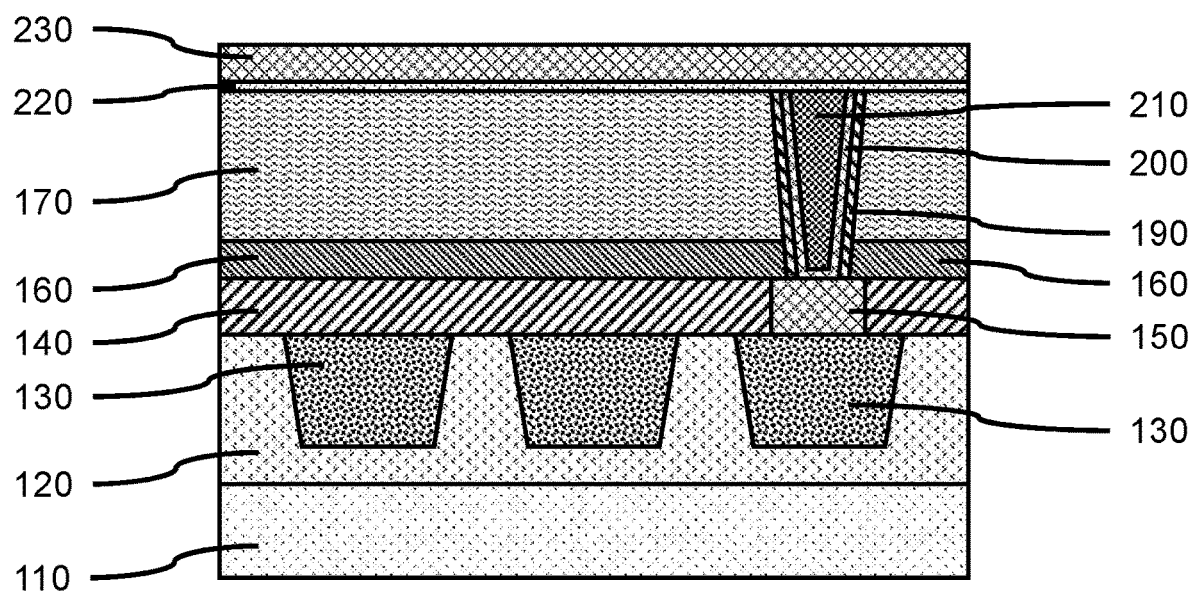
FIG. 8 is a cross-sectional side view showing an amorphization layer formed on the fill layer and phase change material core, and an electrode layer formed on the amorphization layer, in accordance with an embodiment of the present invention.

FIG. 8 is a cross-sectional side view showing an amorphization layer formed on the fill layer and phase change material core, and an electrode layer formed on the amorphization layer, in accordance with an embodiment of the present invention.

In one or more embodiments, an amorphization layer 220 can be formed on the fill layer 170 and phase change material core 210, where the amorphization layer 220 can be formed by a conformal deposition and/or PVD. The amorphization layer 220 can provide a barrier between a subsequently formed electrode layer and the fill layer 170.

In one or more embodiments, an electrode layer 230 can be formed on the amorphization layer 220, where the electrode layer 230 can be formed by a conformal deposition and/or PVD. In various embodiments, the electrode layer 230 can be formed on the fill layer 170 and phase change material core 210 without an intervening amorphization layer 220.

In various embodiments, the electrode layer 230 can be a transition metal, including, but not limited to, tantalum nitride (TaN), titanium nitride (TiN), tungsten nitride (WN), or a combination there of. In various embodiments, the amorphization layer 220 can be a transition metal, including, but not limited to, tantalum (Ta), titanium (Ti), tungsten (W), or a combination there of, where the transition metal of the amorphization layer 220 can be the same transition metal as included in the electrode layer 230. The amorphization layer 220 can provide a surface that prevents the electrode layer 230 from crystallizing.

In various embodiments, the amorphization layer 220 can have a thickness in a range of about 2 nm to about 8 nm, or about 4 nm to about 6 nm, or about 5 nm, although other thicknesses are also contemplated.

In various embodiments, the electrode layer 230 can have a thickness in a range of about 10 nm to about 40 nm, or about 20 nm to about 30 nm, or about 25 nm, although other thicknesses are also contemplated. The thickness of the electrode layer 230 can provide suitable material for photo lithography, so the process can see though the electrode layer 230.

Figure 9:
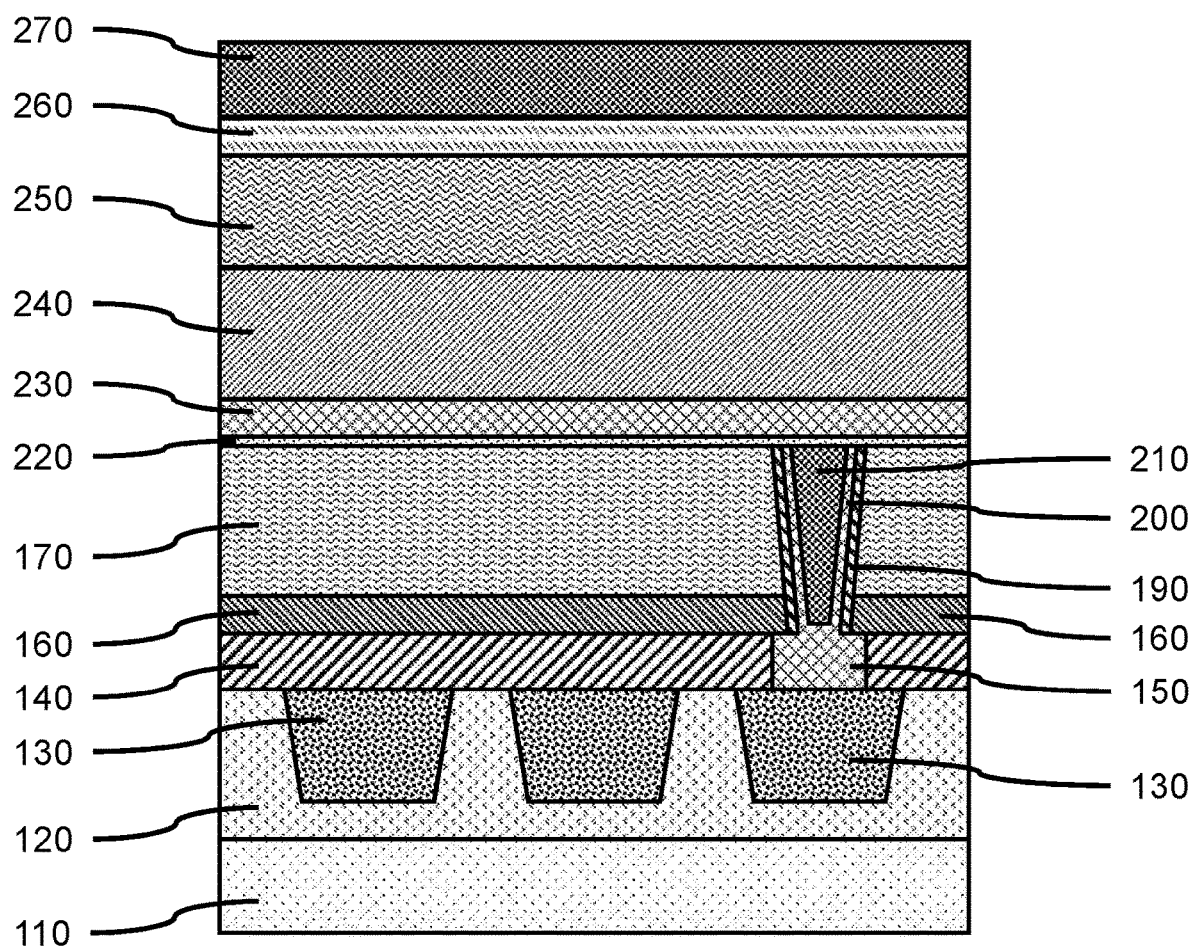
FIG. 9 is a cross-sectional side view showing a sacrificial layer formed on the electrode layer, a planarization layer formed on the sacrificial layer, an anti-reflective coating formed on the planarization layer, and a template layer formed on the anti-reflective coating, in accordance with an embodiment of the present invention.

FIG. 9 is a cross-sectional side view showing a sacrificial layer formed on the electrode layer, a planarization layer formed on the sacrificial layer, an anti-reflective coating formed on the planarization layer, and a template layer formed on the anti-reflective coating, in accordance with an embodiment of the present invention.

In one or more embodiments, a sacrificial layer 240 can be formed on the electrode layer 230, where the sacrificial layer 240 can be formed by a blanket deposition (e.g., PVD, CVD) a conformal deposition (e.g., ALD, PEALD), or combinations thereof.

In various embodiments, the sacrificial layer 240 can be a dielectric material, for example, silicon oxide (SiO), silicon nitride (SiN), silicon oxynitride (SiON), silicon boro carbonitride (SiBCN), or a combination thereof.

In various embodiments, the sacrificial layer 240 can have a thickness in a range of about 50 nm to about 200 nm, or about 75 nm to about 150 nm, or about 100 nm to about 125 nm, although other thicknesses are also contemplated. The thickness of the sacrificial layer 240 can provide sufficient suitable material to protect the electrode layer 230 during etching to avoid unwanted sputtering of the electrode layer material.

In one or more embodiments, a planarization layer 250 can be formed on the sacrificial layer 240, where the planarization layer 250 can be formed by a spin-on process.

The planarization layer 250 can be a developable organic planarization layer, which can be a photo-sensitive organic polymer, including, but not limited to, polyacrylate resin, epoxy resin, phenol resin, polyamide resin, polyimide resin, unsaturated polyester resin, polyphenylenether resin, polyphenylenesulfide resin, or a combination thereof.

In one or more embodiments, an anti-reflective coating 260 can be formed on the planarization layer 250, where the anti-reflective coating 260 can be formed by a blanket deposition.

In various embodiments, the anti-reflective coating (ARC) 260 can be a silicon-containing anti-reflection coating (SiARC), for example, silsesquioxane material that may include polyhedral oligomeric silsesquioxane (POSS).

In one or more embodiments, a template layer 270 can be formed on the anti-reflective coating 260, where the template layer 270 can be formed by spin-on processes. The template layer 270 can be a lithographic resist material.

In various embodiments, the developable organic planarization layer (OPL) 250 can be formed on the sacrificial layer 240, a silicon anti-reflective coating (SiARC) layer 260 can be formed on the developable OPL 250, and the template layer 270 can be formed on the SiARC layer 260.

Figure 10:
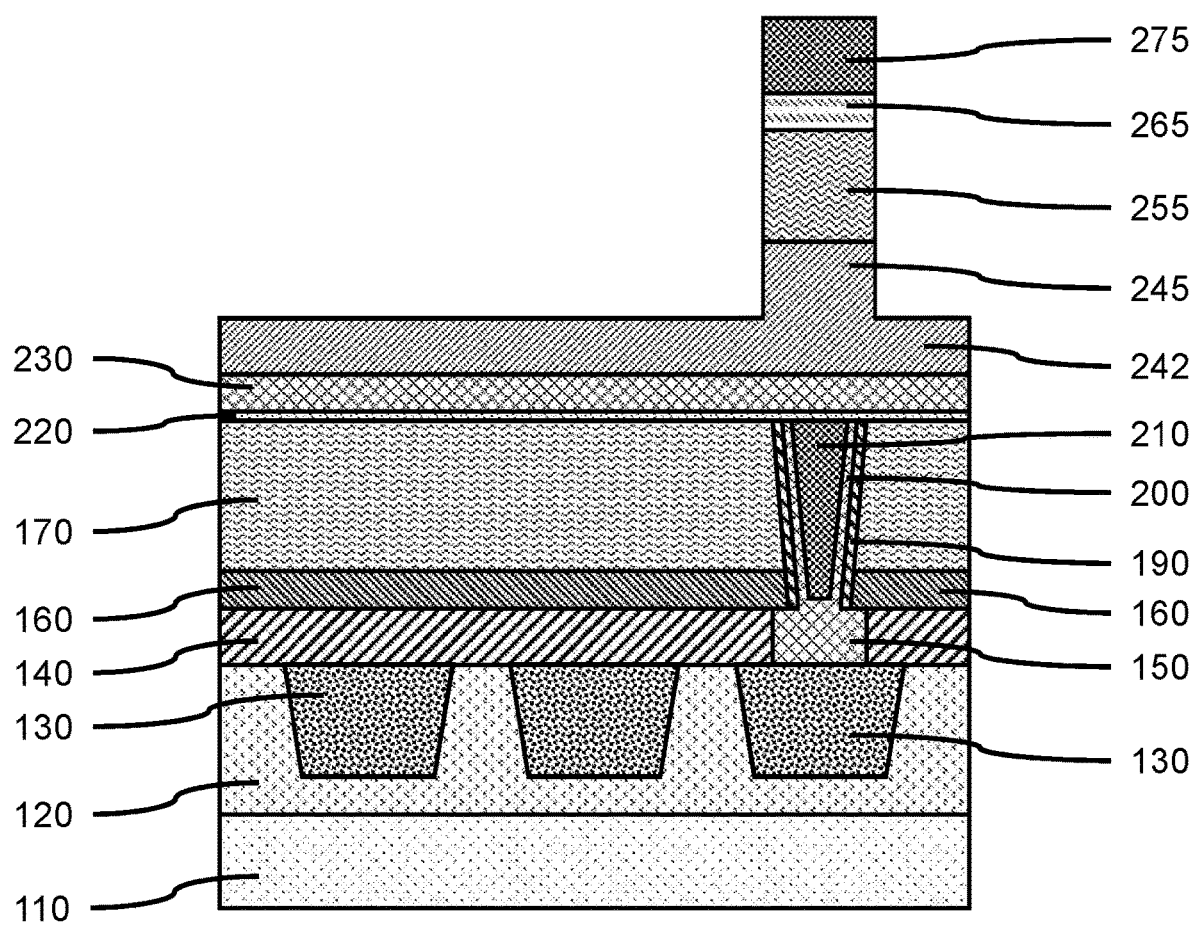
FIG. 10 is a cross-sectional side view showing a template formed on a patterned anti-reflective coating section, planarization layer section, and partially removed sacrificial layer, in accordance with an embodiment of the present invention.

FIG. 10 is a cross-sectional side view showing a template formed on a patterned anti-reflective coating section, planarization layer section, and partially removed sacrificial layer, in accordance with an embodiment of the present invention.

The template layer 270 can be imaged with a pattern to form a template 275, where the template can be formed from the template layer 270 in alignment with the phase change material core 210. The developable ARC layer 260 can be patterned to form a patterned anti-reflective coating section 265, and the developable OPL layer 250 can be patterned to form a planarization layer section 255 using the image pattern. Portions of the ARC layer 260 and OPL layer 250 exposed by patterning and developing the template layer 270 can be removed using a selective directional etch (e.g., RIE).

In various embodiments, a portion of the sacrificial layer 240 can be removed leaving a reduced height sacrificial layer 242 on the electrode layer 230, while forming a sacrificial layer section 245 underneath the planarization layer section 255 and aligned with the phase change material core 210. The reduced height sacrificial layer 242 can cover the electrode layer 230. The template 275 can be removed during the etching of the sacrificial layer 240 by the RIE.

In various embodiments, the sacrificial layer section 245 can have a thickness in a range of about 50 nm to about 195 nm, or about 50 nm to about 150 nm, or about 75 nm to about 150 nm, or about 100 nm to about 195 nm, or about 100 nm to about 150 nm, although other thicknesses are contemplated. In various embodiments, the reduced height sacrificial layer 242 can have a thickness in a range of about 5 nm to about 50 nm, or about 10 nm to about 20 nm, or about 15 nm, although other thicknesses are contemplated. In various embodiments, about 50 nm to about 100 nm of the original thickness of the sacrificial layer 240 can be removed. The thickness of the sacrificial layer section 245 and the reduced height sacrificial layer 242 can have a combined thickness of the initial sacrificial layer 240.

Figure 11:
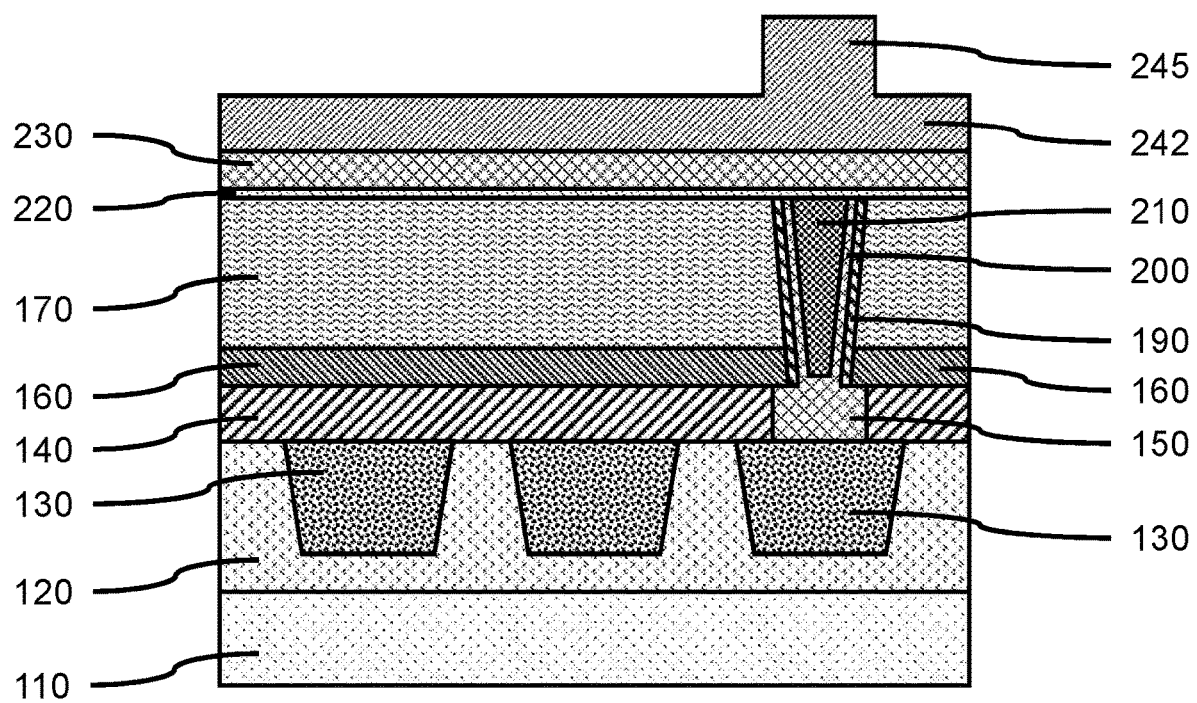
FIG. 11 is a cross-sectional side view showing removal of the template, anti-reflective coating section, and planarization layer section, in accordance with an embodiment of the present invention.

FIG. 11 is a cross-sectional side view showing removal of the template, anti-reflective coating section, and planarization layer section, in accordance with an embodiment of the present invention.

In one or more embodiments, the anti-reflective coating section 265 and planarization layer section 255 can be removed using a chemical strip to expose the underlying sacrificial layer section 245. The anti-reflective coating section 265 and planarization layer section 255 can be removed while the reduced height sacrificial layer 242 remains covering the electrode layer 230, so the electrode layer material has not been sputtered onto the anti-reflective coating section 265 and planarization layer section 255. In various embodiments, the planarization layer section 255 may not be completely removed by the chemical strip, so an RIE/ashing process may be used to completely remove planarization layer section 255.

Figure 12:
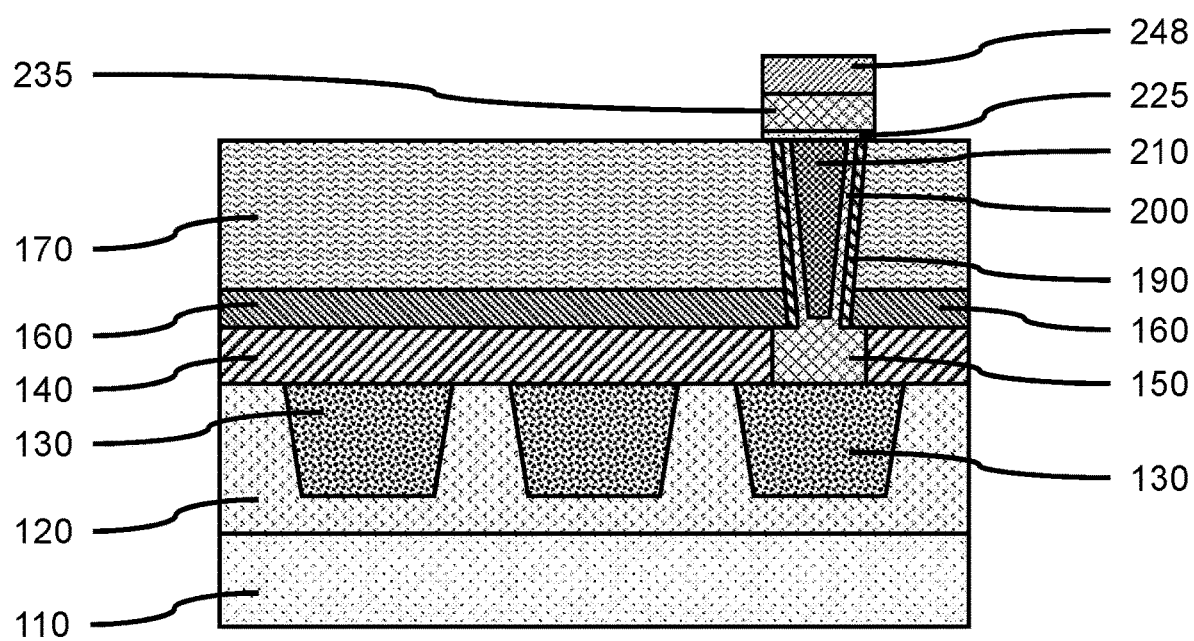
FIG. 12 is a cross-sectional side view showing a sacrificial layer section on a top electrode and amorphization plate over the filled trench, in accordance with an embodiment of the present invention.

FIG. 12 is a cross-sectional side view showing a sacrificial layer section on a top electrode and amorphization plate over the filled trench, in accordance with an embodiment of the present invention.

In one or more embodiments, the electrode layer 230, remaining reduced height sacrificial layer 242 and exposed sacrificial layer section 245 can be etched using an RIE, where the additional thickness of the sacrificial layer section 245 can result in a sacrificial layer plate 248 on a top electrode 235 being formed. The sacrificial layer section 245 is removed during the formation of the top electrode 235, so sputtered top electrode material is removed during the process. The RIE can also be used to form an amorphization plate 225 over the trench and phase change material core 210.

In various embodiments, a TaN material layer can be removed using dry etching with a chlorine ($Cl_2$) and argon (Ar) gas mixture, carbon tetrafluoride ($CF_4$), chloro-trifluoro methane ($CF_3Cl$), fluoroform ($CHF_3$), or combinations thereof.

Figure 13:
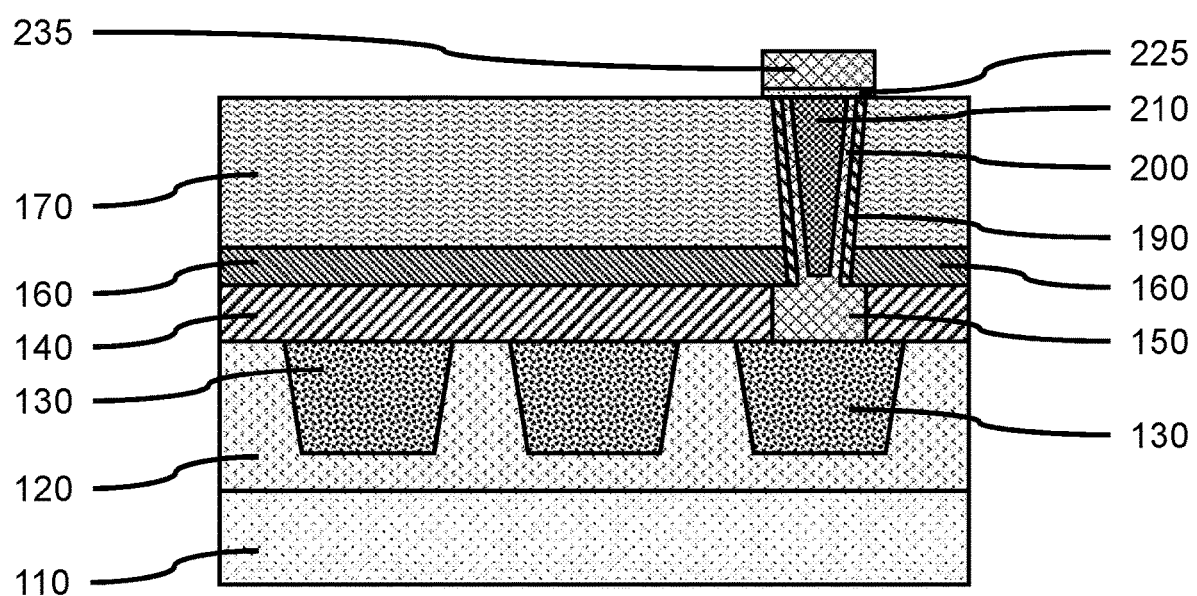
FIG. 13 is a cross-sectional side view showing removal of the sacrificial layer section from the top electrode, in accordance with an embodiment of the present invention.

FIG. 13 is a cross-sectional side view showing removal of the sacrificial layer plate from the top electrode, in accordance with an embodiment of the present invention.

In one or more embodiments, the sacrificial layer plate 248 can be removed from the top electrode 235 and amorphization plate 225 using a selective wet chemical etch. In various embodiments, a dilute hydrofluoric acid etch can be used to remove a silicon nitride (SiN) sacrificial layer plate 248, where remaining deposited top electrode material can be lifted off with the sacrificial layer plate 248.

Figure 14:
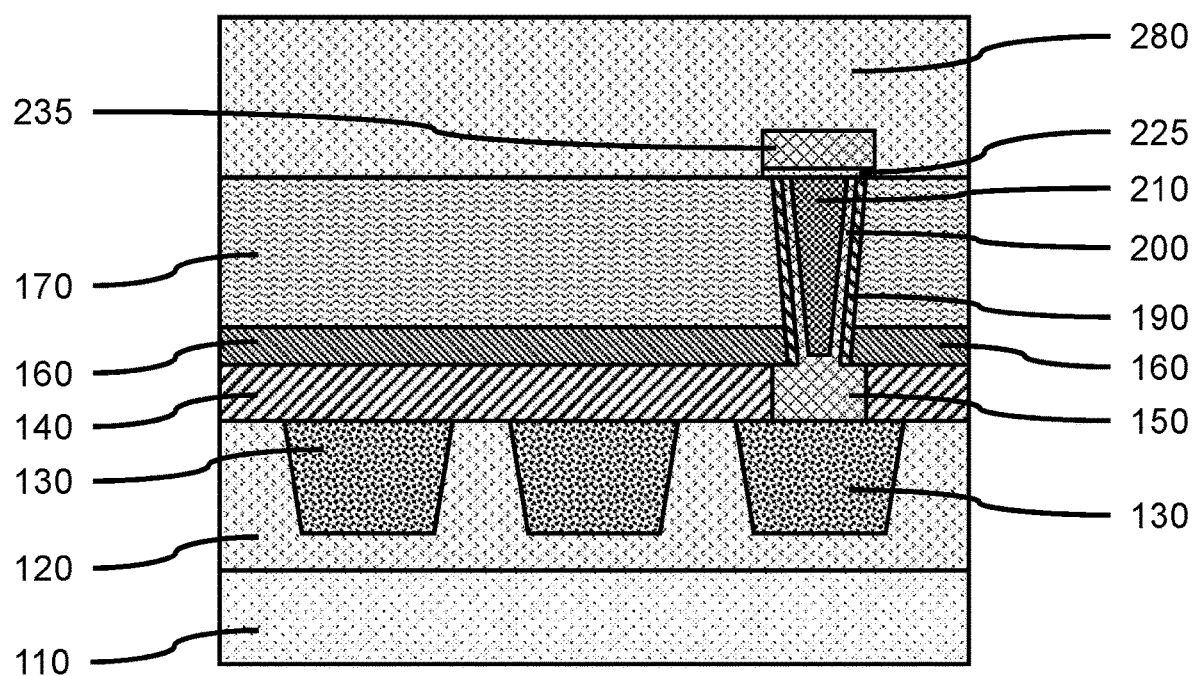
FIG. 14 is a cross-sectional side view showing a second interlayer dielectric (ILD) layer formed on the fill layer and the top electrode, in accordance with an embodiment of the present invention.

FIG. 14 is a cross-sectional side view showing a second interlayer dielectric (ILD) layer formed on the fill layer and the top electrode, in accordance with an embodiment of the present invention.

In one or more embodiments, a second interlayer dielectric (ILD) layer 280 can be formed on the fill layer 170 and the top electrode 235, where the second ILD layer 280 can be formed by a blanket deposition.

In one or more embodiments, the second interlayer dielectric (ILD) layer 280 can be a dielectric material, including, but not limited to, silicon oxide (SiO) a low-k dielectric material, for example, fluorine doped silicon oxide (SiO:F), carbon doped silicon oxide (SiO:C), hydrogen silsesquioxane (HSQ) and methylsilsesquioxane (MSQ), tetraethoxysilane (TEOS), and combinations thereof. The second ILD layer 280 can be the same or a different dielectric material as the first ILD layer 120. The second ILD layer 280 can be the same or a different dielectric material as the fill layer 170.

Figure 15:
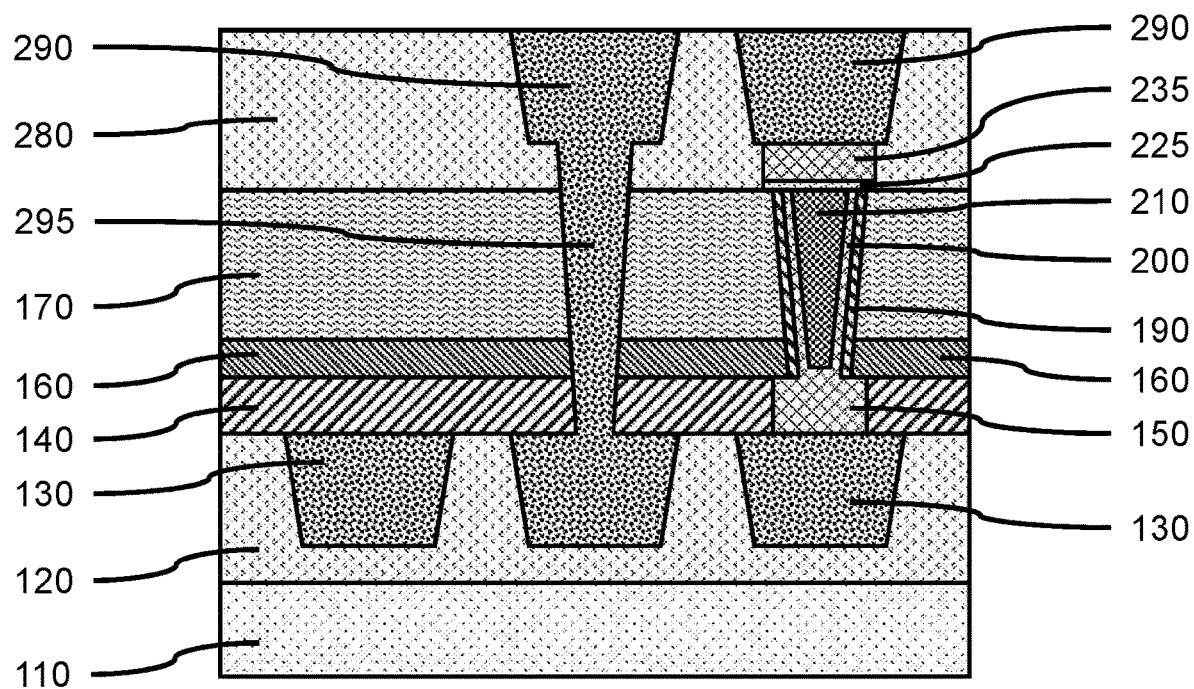
FIG. 15 is a cross-sectional side view showing upper conductive pads formed in the second interlayer dielectric (ILD) layer on the top electrode and above a lower conductive pad with a via electrically connecting the upper conductive pad to the lower conductive pad, in accordance with an embodiment of the present invention.

FIG. 15 is a cross-sectional side view showing upper conductive pads formed in the second interlayer dielectric (ILD) layer on the top electrode and above a lower conductive pad with a via electrically connecting the upper conductive pad to the lower conductive pad, in accordance with an embodiment of the present invention.

In one or more embodiments, upper conductive pads 290 can be formed in the second ILD layer 280, where the upper conductive pads 290 can be formed on the top electrode 235 and above a lower conductive pad 130. A via 295 can be formed through the second ILD layer 280 and fill layer 170 to electrically connect an upper conductive pad 290 to a lower conductive pad 130. The via can be formed by RIE and filled by a deposition (e.g., ALD, CVD, PVD) during formation of the upper conductive pads 290.

In various embodiments, the upper conductive pads 290 and via(s) 295 can be a metal, including, but not limited to, copper (Cu), aluminum (Al), tungsten (W), manganese (MN), molybdenum (Mo), platinum (Pt), gold (Au), silver (Ag), a nonmetal, for example, graphite, carbons nanotubes (CNTs), or suitable combinations thereof.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another elements) or feat s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and a method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a phase change memory device, comprising:
   depositing an electrode layer on a phase change material core;
   forming a sacrificial layer on the electrode layer;
   depositing a planarization layer on the sacrificial layer;
   depositing an anti-reflective coating on the planarization layer;
   forming a template on the anti-reflective coating;
   removing a portion of the anti-reflective coating to form an anti-reflective coating section, a portion of the planarization layer to form a planarization layer section, and a portion of the sacrificial layer to form a reduced height sacrificial layer and a sacrificial layer section beneath the planarization layer section;
   removing the anti-reflective coating section and planarization layer section to expose the sacrificial layer section; and
   removing the reduced height sacrificial layer and a portion of the electrode layer to form a top electrode on the phase change material core and a sacrificial layer plate on the top electrode.

2. The method of claim 1, further comprising forming an amorphization layer on the phase change material core prior to depositing the electrode layer on the phase change material core.

3. The method of claim 2, further comprising removing a portion of the amorphization layer to form an amorphization plate between the phase change material core and the top electrode.

4. The method of claim 3, further comprising removing the sacrificial layer plate.

5. The method of claim 4, further comprising forming a second interlayer dielectric (ILD) layer on the top electrode.

6. The method of claim 5, wherein the anti-reflective coating section and planarization layer section are removed using a chemical strip.

7. The method of claim 6, wherein the electrode layer is tantalum nitride (TaN).

8. The method of claim 7, wherein the sacrificial layer is silicon nitride (SiN).

9. The method of claim 8, wherein the amorphization layer is the same transition metal as included in the electrode layer.

10. A method of forming a phase change memory device, comprising:
    forming a bottom electrode on a substrate;
    forming a phase change material core on the bottom electrode;
    depositing an electrode layer on the phase change material core;
    forming a sacrificial layer on the electrode layer;
    depositing a planarization layer on the sacrificial layer;
    depositing an anti-reflective coating on the planarization layer;
    forming a template on the anti-reflective coating;
    removing a portion of the anti-reflective coating to form an anti-reflective coating section, a portion of the planarization layer to form a planarization layer section, and a portion of the sacrificial layer to form a reduced height sacrificial layer and a sacrificial layer section beneath the planarization layer section;
    removing the anti-reflective coating section and planarization layer section to expose the sacrificial layer section; and
    removing the reduced height sacrificial layer and a portion of the electrode layer to form a top electrode on the phase change material core and a sacrificial layer plate on the top electrode.

11. The method of claim 10, wherein the electrode layer is a transition metal nitride.

12. The method of claim 11, wherein the electrode layer is tantalum nitride (TaN).

13. The method of claim 11, wherein the sacrificial layer is silicon nitride (SiN).

14. The method of claim 13, wherein the planarization layer is a photo-sensitive organic polymer selected from the group consisting of polyacrylate resin, epoxy resin, phenol resin, polyamide resin, polyimide resin, unsaturated polyester resin, polyphenylenether resin, polyphenylenesulfide resin, and a combination thereof.

15. The method of claim 13, wherein the sacrificial layer has a thickness in a range of about 50 nm to about 200 nm, and the electrode layer has a thickness in a range of about 10 nm to about 40 nm.

16. A method of forming a phase change memory device, comprising:
    forming a bottom electrode on a substrate;
    forming a phase change material core on the bottom electrode;
    depositing a tantalum nitride electrode layer on the phase change material core;
    forming a silicon nitride sacrificial layer on the electrode layer;
    depositing a planarization layer on the sacrificial layer;
    depositing an anti-reflective coating on the planarization layer;
    forming a template on the anti-reflective coating;
    removing a portion of the anti-reflective coating to form an anti-reflective coating section, a portion of the planarization layer to form a planarization layer section, and a portion of the sacrificial layer to form a reduced height sacrificial layer and a sacrificial layer section beneath the planarization layer section;
    removing the anti-reflective coating section and planarization layer section to expose the sacrificial layer section; and
    removing the reduced height sacrificial layer and a portion of the electrode layer to form a top electrode on the phase change material core and a sacrificial layer plate on the top electrode.

17. The method of claim 16, wherein the portion of the electrode layer is removed using a reactive ion etch (RIE).

18. The method of claim 17, wherein the anti-reflective coating section and planarization layer section are removed using a chemical strip.

19. The method of claim 17, wherein the sacrificial layer section has a thickness in a range of about 50 nm to about 100 nm.

20. The method of claim 19, further comprising removing the sacrificial layer plate.

* * * * *